United States Patent
Shih

(10) Patent No.: US 6,348,409 B1
(45) Date of Patent: Feb. 19, 2002

(54) SELF ALIGNED CONTACT PLUG TECHNOLOGY

(75) Inventor: Cheng-Yeh Shih, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/283,852

(22) Filed: Apr. 1, 1999

(51) Int. Cl.[7] ............... H01L 21/331; H01L 21/4763; H01L 21/44
(52) U.S. Cl. ............ 438/647; 438/684; 438/675; 438/364
(58) Field of Search ............... 438/647, 684, 438/675, 364

(56) References Cited

U.S. PATENT DOCUMENTS

| 5,521,119 A | * | 5/1996 | Chen | 437/187 |
| 5,661,334 A | * | 8/1997 | Akram | 257/632 |
| 5,723,374 A | | 3/1998 | Huang et al. | 438/253 |
| 5,763,303 A | | 6/1998 | Liaw et al. | 438/210 |
| 5,766,992 A | | 6/1998 | Chou et al. | 438/241 |
| 5,795,827 A | | 8/1998 | Liaw et al. | 438/663 |
| 6,001,730 A | * | 12/1999 | Farkas | 438/727 |
| 6,069,074 A | * | 5/2000 | Fu | 438/653 |

* cited by examiner

Primary Examiner—Matthew Smith
Assistant Examiner—Chuong A Luu
(74) Attorney, Agent, or Firm—George O. Saile; Stephen B. Ackerman; Larry J. Prescott

(57) ABSTRACT

A method of forming self aligned contacts in silicon integrated circuit wafers which has a reduced contact resistance is described. A contact hole formed in a layer of dielectric is filled with polysilicon using a split polysilicon process. A first polysilicon layer is deposited after the contact hole is opened. The first polysilicon is preferably, but not necessarily, high temperature film doped polysilicon. The first polysilicon is then treated using $C_2F_6/O_2$. A second polysilicon layer, preferably furnace doped polysilicon, is then deposited to completely fill the contact hole. The wafer is then planarized, using chemical mechanical polishing or back etching, leaving polysilicon completely filling the contact hole and forming a low resistance contact.

18 Claims, 2 Drawing Sheets

SELF ALIGNED CONTACT PLUG TECHNOLOGY

BACKGROUND OF THE INVENTION

(1) Field of the Invention

This invention relates to forming conducting plugs to form self aligned contacts and more particularly to forming polysilicon plugs to fill contact holes in low resistance self aligned contacts.

(2) Description of the Related Art

Self aligned contacts in silicon integrated circuit wafers are frequently formed using a metal silicide process such as $TiSi_x$. Contacts are also formed using a single polysilicon process to form a polysilicon plug followed by etchback or chemical mechanical polishing to remove the polysilicon not filling the contact hole.

U.S. Pat. No. 5,723,374 to Huang et al. describes the use of polysilicon to form a contact hole plug in forming a self aligned contact.

U.S. Pat. No. 5,795,827 to Liaw et al. describes the formation of a polycide contact structure using a high temperature, rapid thermal anneal to form a self aligned contact.

U.S. Pat. No. 5,763,303 to Liaw et al. describes the use of a rapid thermal chemical vapor deposition procedure, RTCVD, in the formation of self aligned contacts.

U.S. Pat. No. 5,766,992 to Chou et al. describes the formation of self aligned contacts in MOSFET devices using silicon nitride spacers to protect the polysilicon gate electrode during the opening of the self aligned contact hole.

SUMMARY OF THE INVENTION

The circuits in integrated circuit wafers require the use of electrical contacts to make electrical connection between the patterned conductors on the wafers and the various devices in the wafer. The contact resistance of these electrical contacts is key to their usefulness and must be kept as low as possible. Self aligned contacts are often used for these electrical contacts and are formed through a contact hole formed in a layer of dielectric. Good step coverage in filling the contact hole is very important in achieving a low contact resistance. Silicide contacts, such as $TiSi_x$, are often used for such contacts. There is an increasing need for electrical contacts having improved step coverage over the edges of the contact hole and lower contact resistance.

It is a principle objective of this invention to provide a method of forming an electrical contact which provides good step coverage in filling the contact hole and reduced contact resistance.

This objective is achieved using a two step polysilicon process to fill the contact holes. A contact hole is opened in a layer of dielectric exposing the region of the wafer where the contact will be formed. A layer of first polysilicon, preferably a high temperature film, HTF, deposition doped polysilicon, is deposited to cover the sidewalls and bottom of the contact holes. Ion implantation is then used to deposit impurities through the layer of first polysilicon into the region of the wafer where the contact will be formed. The first polysilicon deposited on the sidewalls and bottom of the contact holes is then treated with $C_2F_6/O_2$. A layer of second polysilicon, preferably furnace doped polysilicon, is then deposited over the first polysilicon to complete the filling of the contact hole. The wafer is then planarized using chemical mechanical polishing or etchback.

DESCRIPTION OF THE PREFERRED EMBODIMENTS

Figure 1:
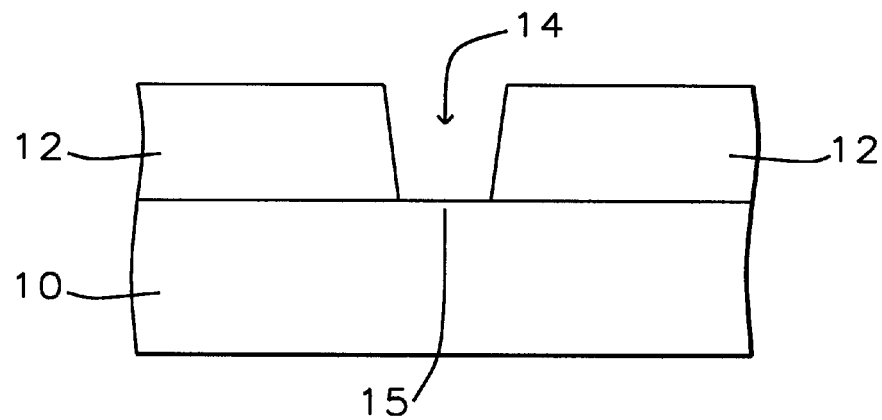
FIG. 1 shows a cross section view of a part of a silicon integrated circuit wafer showing a contact hole formed in a layer of dielectric.

Refer now to FIGS. 1–6 for a description of the method of forming contacts of this invention. FIG. 1 shows a cross section of a part of a silicon integrated circuit wafer 10 having devices formed therein, not shown. A layer of dielectric 12, such as silicon oxide, spin on glass, borophosphosilicate glass, or the like is formed over the silicon integrated circuit wafer 10. A contact hole 14 is formed in the layer of dielectric 12 exposing the silicon wafer at the wafer contact region 15, which is the region of the wafer where the electrical contact will be formed.

Figure 2:
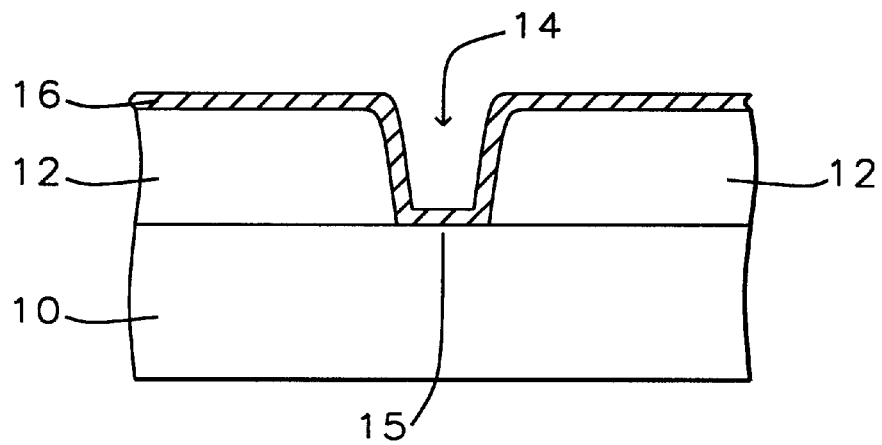
FIG. 2 shows the cross section view of the wafer after the layer of first polysilicon has been deposited.
Figure 3:
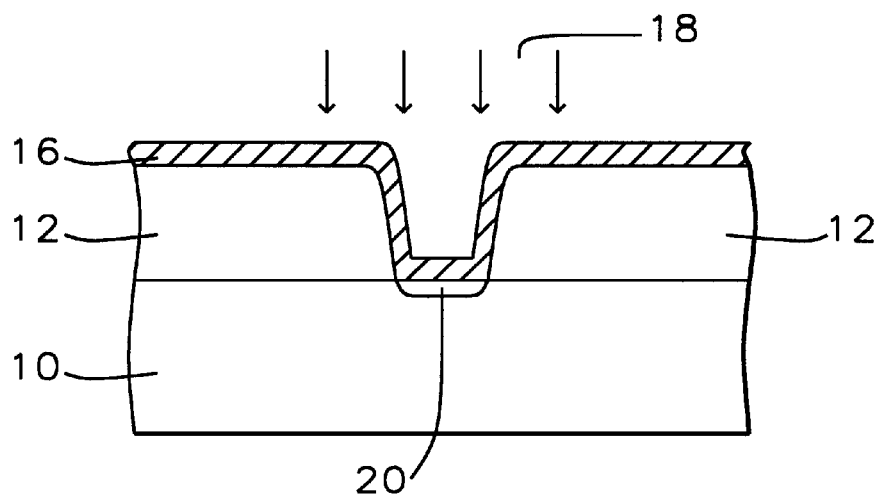
FIG. 3 shows the cross section view of the wafer showing ion implantation of impurities through the first polysilicon into the contact region of the wafer.
Figure 4:
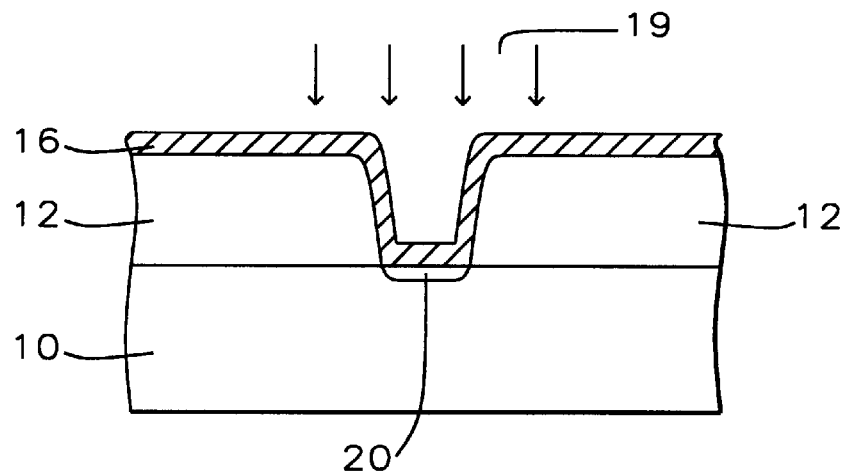
FIG. 4 shows the cross section view of the wafer showing the first polysilicon being treated with $C_2F_6/O_2$.

As shown in FIG. 2 a layer of first polysilicon 16, having a thickness of between about 200 and 5000 Angstroms is formed on the layer of dielectric 12 covering the sidewalls of the contact hole 14 and the exposed part of the wafer contact region 15. Preferably the first polysilicon is high temperature film, HTF, doped polysilicon deposited at about 650° C., however other doped polysilicon or undoped polysilicon can be used. If undoped polysilicon is used as the first polysilicon it must be later doped using a method such as ion implantation, Next, as shown in FIG. 3, the wafer contact region is doped using ion implantation through the first polysilicon layer 16, forming a doped contact region 20. The ion implantation uses a beam 18 of ions such as $PH_3$ or the like having an energy of between about 20 and 80 KeV to form the doped contact region 20. Next as shown in FIG. 4 the first polysilicon 16 in the region of the contact hole is given a post treatment in a reducing atmosphere, preferably in an environment of $C_2F_6/O_2$ gas at a temperature of between about 400° C. and 900° C. for between about 30 and 120 minutes. FIG. 4 shows the post treatment carried out using a stream 19 of $C_2F_6/O_2$ gas. The preferred post treatment uses an environment of $C_2F_6/O_2$, however other reducing environments, such as using $N_2/H_2$, can be used. The post treatment removes any native oxide from the first polysilicon.

Figure 5:
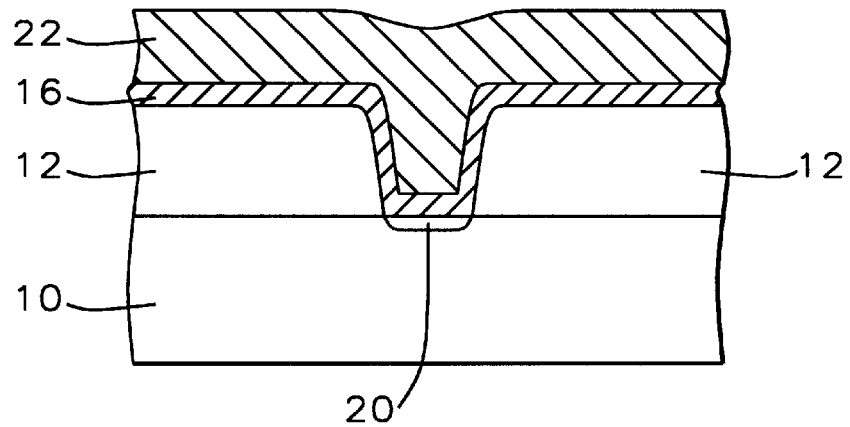
FIG. 5 shows the cross section view of the wafer after depositing the layer of second polysilicon to fill the contact hole.
Figure 6:
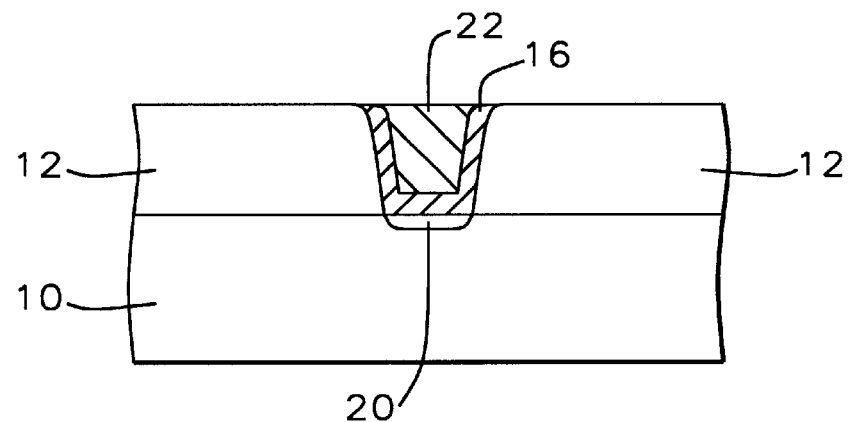
FIG. 6 shows the cross section view of the wafer after the wafer has been planarized.

Next, as shown in FIG. 5, a layer of second polysilicon 22, is formed over the layer of first polysilicon 16 to fill the contact hole with polysilicon. Preferably the second polysilicon 22 is furnace doped polysilicon, however other types of polysilicon can be used. The second polysilicon has a thickness of between about 500 and 10,000 Angstroms. The post treatment, preferably using $C_2F_6/O_2$ gas has the effect of removing native oxide from the HTF polysilicon film, or other first polysilicon, so that there is no interface between the first polysilicon layer and second polysilicon layer, keeping the contact resistance low. If undoped polysilicon is used as the second polysilicon it must later be doped. Next, as shown in FIG. 6 the wafer is planarized using a method such as chemical mechanical polishing or back etching with dry anisotropic etching using $SF_6/Ar/N_2$ as an etchant. The post treatment using $C_2F_6/O_2$ or $N_2/H_2$, is important to removing interface impurities and reducing the electrical resistance between the first polysilicon and second polysilicon. The final electrical contact has a substantially reduced contact resistance because of the doped contact region 20 and the post treatment, preferably using $C_2F_6/O_2$.

While the invention has been particularly shown and described with reference to the preferred embodiments thereof, it will be understood by those skilled in the art that various changes in form and details may be made without departing from the spirit and scope of the invention.

What is claimed is:

1. A method of forming a self aligned contact plug, comprising:

providing a silicon wafer having a contact region;

forming a layer of dielectric having a first surface and a second surface on said wafer, wherein said second surface of said layer of dielectric contacts said silicon wafer;

forming a contact hole having sidewalls in said layer of dielectric over said contact region thereby removing said dielectric from said contact region;

depositing a layer of first polysilicon on said layer of dielectric after forming said contact hole, thereby depositing said first polysilicon on said sidewalls of said contact hole and said contact region of said wafer;

implanting impurities through said layer of said first polysilicon into said contact region using ion implantation;

exposing that part of said layer of said first polysilicon on said sidewalls of said layer of dielectric and over said contact region to $C_2F_6/O_2$ after implanting said impurities into said contact region;

depositing a layer of second polysilicon on said layer of said first polysilicon after exposing said first polysilicon to $C_2F_6/O_2$, thereby filling said contact hole with said first polysilicon and said second polysilicon; and planarizing said silicon wafer thereby removing that part of said first polysilicon and said second polysilicon above the plane formed by said first surface of said layer of dielectric.

2. The method of claim 1 wherein said first polysilicon is high temperature film polysilicon.

3. The method of claim 1 wherein said planarizing said silicon wafer is accomplished using chemical mechanical polishing.

4. The method of claim 1 wherein said planarizing said silicon wafer is accomplished using vertical anisotropic etching with $SF_6/Ar/N_2$ as an etchant.

5. The method of claim 1 wherein said second polysilicon is furnace doped polysilicon.

6. The method of claim 1 wherein said implanting impurities into said contact region is accomplished using ion implantation to implant $PH_3$ ions.

7. The method of claim 1 wherein said layer of said first polysilicon has a thickness of between about 200 and 5000 Angstroms.

8. The method of claim 1 wherein said layer of said second polysilicon has a thickness of between about 500 and 10,000 Angstroms.

9. The method of claim 1 wherein that part of said layer of said first polysilicon on said sidewalls of said contact hole and over said contact region is exposed to said $C_2F_6/O_2$ for between about 30 and 120 minutes at a temperature of between about 400° C. and 900° C.

10. A method of forming a self aligned contact plug, comprising:

providing a silicon wafer having a contact region;

forming a layer of dielectric on said wafer;

forming a contact hole having sidewalls in said layer of dielectric over said contact region thereby exposing removing said dielectric from said contact region;

depositing a layer of first doped polysilicon on said layer of dielectric after forming said contact hole, thereby depositing said first doped polysilicon on said sidewalls of said contact hole and said contact region of said wafer;

implanting impurities through said layer of first doped polysilicon into said contact region using ion implantation;

exposing that part of said layer of said first doped polysilicon on said sidewalls of said contact hole and over said contact region to $C_2F_6/O_2$ after implanting said impurities into said contact region;

depositing a layer of second doped polysilicon on said layer of said first doped polysilicon after exposing said first doped polysilicon to $C_2F_6/O_2$, thereby filling said contact hole with said first doped polysilicon and said second doped polysilicon; and planarizing said silicon wafer thereby removing that part of said first doped polysilicon and said second doped polysilicon above the plane formed by said first surface of said layer of dielectric.

11. The method of claim 10 wherein said first doped polysilicon is high temperature film doped polysilicon.

12. The method of claim 10 wherein said planarizing said silicon wafer is accomplished using chemical mechanical polishing.

13. The method of claim 10 wherein said planarizing said silicon wafer is accomplished using vertical anisotropic etching with $SF_6/Ar/N_2$ as an etchant.

14. The method of claim 10 wherein said second doped is furnace doped polysilicon.

15. The method of claim 10 wherein said implanting impurities in said contact region is accomplished using ion implantation to implant $PH_3$ ions.

16. The method of claim 10 wherein said layer of said first doped polysilicon has a thickness of between about 200 and 5000 Angstroms.

17. The method of claim 10 wherein said layer of said second doped polysilicon has a thickness of between about 500 and 10,000 Angstroms.

18. The method of claim 10 wherein that part of said layer of said first doped polysilicon on said sidewalls of said contact hole and over said contact region is exposed to said $C_2F_6/O_2$ for between about 30 and 120 minutes at a temperature of between about 400° C. and 900° C.

* * * * *